United States Patent
Uezato

(10) Patent No.: US 11,133,271 B2
(45) Date of Patent: Sep. 28, 2021

(54) SEMICONDUCTOR DEVICE

(71) Applicant: FUJI ELECTRIC CO., LTD., Kawasaki (JP)

(72) Inventor: Yoshinori Uezato, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/800,537

(22) Filed: Feb. 25, 2020

(65) Prior Publication Data

US 2020/0194386 A1 Jun. 18, 2020

Related U.S. Application Data

(63) Continuation of application No. PCT/JP2019/002647, filed on Jan. 28, 2019.

(30) Foreign Application Priority Data

Mar. 1, 2018 (JP) .............................. JP2018-036107

(51) Int. Cl.
*H01L 23/58* (2006.01)
*H01L 23/15* (2006.01)
*H01L 23/367* (2006.01)

(52) U.S. Cl.
CPC ............ *H01L 23/585* (2013.01); *H01L 23/15* (2013.01); *H01L 23/3672* (2013.01)

(58) Field of Classification Search
CPC .... H01L 23/585; H01L 23/15; H01L 23/3672
See application file for complete search history.

(56) References Cited

U.S. PATENT DOCUMENTS

| | | |
|---|---|---|
| 5,527,620 A | 6/1996 | Schulz-Harder |
| 2008/0164588 A1 | 7/2008 | Lee et al. |
| 2009/0243089 A1* | 10/2009 | Hohlfeld ............... H05K 3/0061 257/734 |
| 2014/0153238 A1* | 6/2014 | Nishimura ........... H01L 25/0753 362/237 |
| 2018/0005956 A1 | 1/2018 | Degreeve |
| 2018/0286778 A1* | 10/2018 | Spann .................... H01L 25/07 |

FOREIGN PATENT DOCUMENTS

| | | |
|---|---|---|
| EP | 3264869 A1 | 1/2018 |
| JP | 2003-100965 A | 4/2003 |
| JP | 2006-245436 A | 9/2006 |
| JP | 2012-114203 A | 6/2012 |
| JP | 2015-225948 A | 12/2015 |

OTHER PUBLICATIONS

International Search Report for PCT/JP2019/002647, dated Apr. 9, 2019.
Written Opinion for PCT/JP2019/002647, dated Apr. 9, 2019.

* cited by examiner

*Primary Examiner* — Peniel M Gumedzoe
(74) *Attorney, Agent, or Firm* — Rabin & Berdo, P.C.

(57) ABSTRACT

In a semiconductor device, a first outer edge of a conductive pattern is located between the outermost edge of a first dimple and the innermost edge of a second dimple in a cross-sectional view of the device. When thermal stress due to temperature changes in the semiconductor device is applied to the ceramic circuit board, the first and second dimples suppress deformation of the ceramic circuit board that is caused due to the temperature changes. As a result, cracks in the ceramic circuit board and separation of the metal plate and the conductive pattern are prevented.

20 Claims, 7 Drawing Sheets

SEMICONDUCTOR DEVICE

CROSS-REFERENCE TO RELATED APPLICATION

This application is a continuation application of International Application PCT/JP2019/002647 filed on Jan. 28, 2019 which designated the U.S., which claims priority to Japanese Patent Application No. 2018-036107, filed on Mar. 1, 2018, the entire contents of which are incorporated herein by reference.

BACKGROUND OF THE INVENTION

1. Field of the Invention

The embodiments discussed herein relate to a semiconductor device.

2. Background of the Related Art

Semiconductor devices having semiconductor elements such as IGBTs (Insulated Gate Bipolar Transistors) and power MOSFETs (Metal Oxide Semiconductor Field Effect Transistors) are used as power conversion devices, for example. Such a semiconductor device includes semiconductor elements and a ceramic circuit board that has an electrical insulating board, a plurality of conductive patterns which are formed on the front surface of the electrical insulating board and on which the semiconductor elements are disposed, and a metal plate disposed on the rear surface of the electrical insulating board. In addition, for example, the ceramic circuit board is disposed on a heat dissipation unit made of copper, such as a heat sink, so that the semiconductor device reduces heat generated by the semiconductor element during its operation.

The above semiconductor device is heated and then cooled when the semiconductor elements are soldered to the ceramic circuit board and the ceramic circuit board is soldered to the heat dissipation unit. In addition, the semiconductor device is subjected to temperature changes due to both its operation and external environment. Therefore, thermal stress is applied to the ceramic circuit board due to a difference in thermal expansion coefficient between the conductive patterns and the metal plate with respect to the electrical insulating board. When the thermal stress is applied to the ceramic circuit board, the electrical insulating board may be broken. This leads to unreliability of the semiconductor device.

To deal with this, there has been proposed a technique of forming dimples (holes) in the ceramic circuit board to reduce thermal stress that is generated in the ceramic circuit board (see, for example, U.S. Pat. No. 5,527,620).

There has been a technique of forming dimples in the front surface of a conductive pattern in a ceramic circuit board. See U.S. Pat. No. 5,527,620. This technique, however, reduces a mounting area where semiconductor elements, electronic parts, wiring members, and others are to be mounted, and therefore a relatively large ceramic circuit board is needed.

SUMMARY OF THE INVENTION

According to an aspect, there is provided a semiconductor device, including: a semiconductor element; and a substrate including an electrical insulating board having a front surface and a rear surface opposite to the front surface, a conductive pattern provided on the front surface of the electrical insulating board, and having a first outer edge, the semiconductor element being disposed on the conductive pattern, and a metal plate disposed on the rear surface of the electrical insulating board, having a front surface facing the rear surface of the insulating board, and a rear surface opposite to the front surface of the metal plate, and having a second outer edge that is located outside of a corresponding position of the first outer edge of the conductive pattern, the metal plate having a plurality of first concave portions respectively provided along at least a part of an outer periphery of the metal plate in the rear surface of the metal plate, for each of the first concave portion, an outermost point on an outer edge, which is closer to the second outer edge than any other points on the outer edge, is located outside the first outer edge of the conductive pattern in a cross-sectional view of the device.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, preferred embodiments will be described with reference to the accompanying drawings.

First Embodiment

Figure 1:
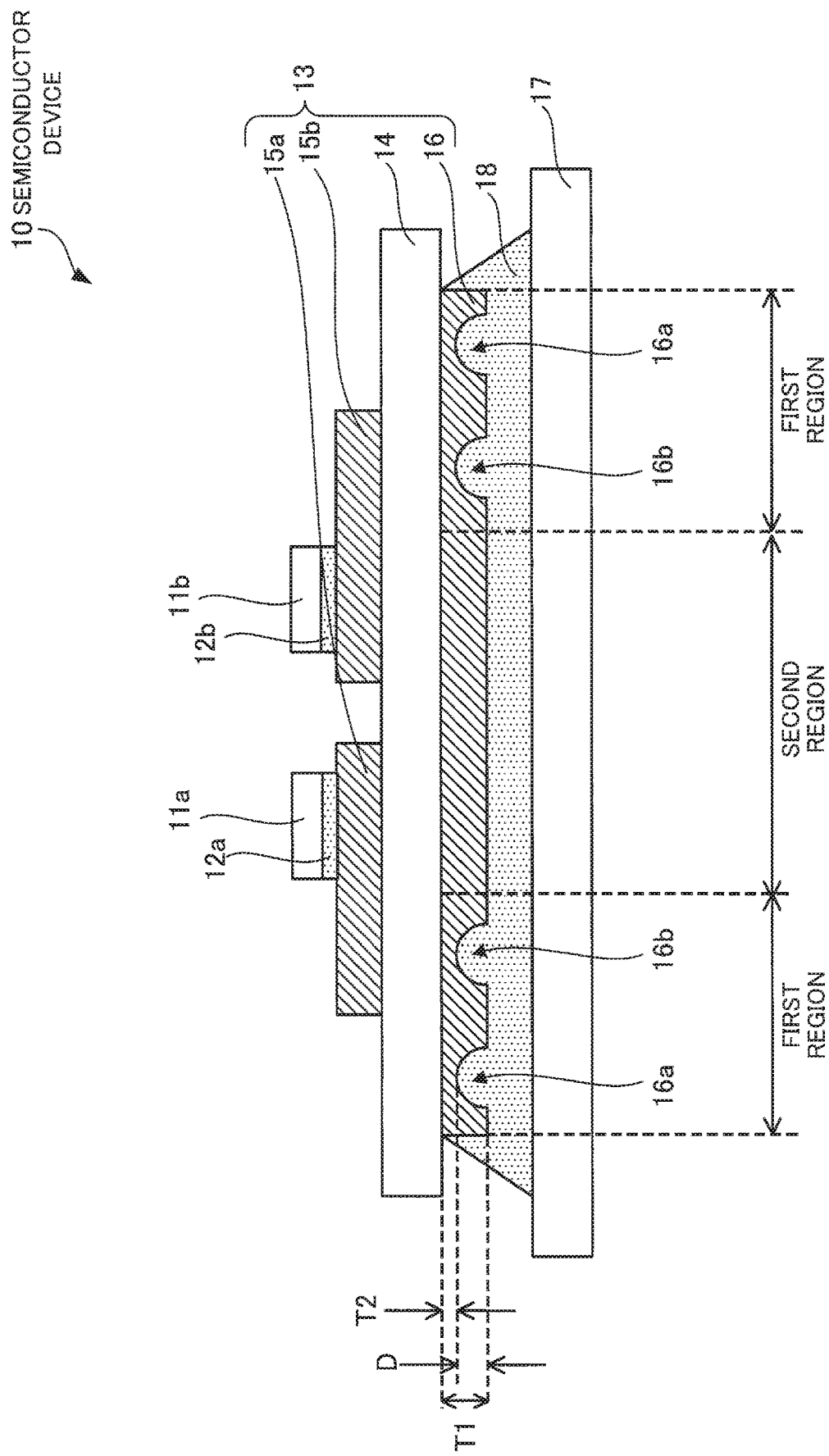
FIG. 1 is a cross-sectional view of a semiconductor device according to a first embodiment.

A semiconductor device of a first embodiment will now be described with reference to FIG. 1. FIG. 1 is a cross-sectional view of the semiconductor device according to the first embodiment. As illustrated in FIG. 1, the semiconductor device 10 includes semiconductor elements 11*a* and 11*b*, a ceramic circuit board 13 (substrate) where the semiconductor elements 11*a* and 11*b* are joined to its front surface, and a heat dissipation plate 17 joined to the rear surface of the ceramic circuit board 13. In this connection, the cross-sectional view of the semiconductor device 10 illustrated in FIG. 1 includes a first region 16*c* and a second region 16*d* indicated in FIG. 2, to be described later.

Examples of the semiconductor elements 11*a* and 11*b* include switching elements such as IGBTs and power MOS- FETs. The switching elements are made of silicon or silicon carbide. Such semiconductor elements 11a and 11b each have a drain electrode (or collector electrode) on its rear surface and a gate electrode and a source electrode (or emitter electrode) on its front surface. In addition, the semiconductor elements 11a and 11b may include diodes such as SBDs (Schottky Barrier Diodes) and FWDs (Free Wheeling Diodes) where needed. Such semiconductor elements 11a and 11b each have a cathode electrode as a main electrode on its rear surface and an anode electrode as a main electrode on its front surface. In this connection, although FIG. 1 illustrates two semiconductor elements 11a and 11b by way of example, the number of semiconductor elements is not limited thereto and a desired number of semiconductor elements may be disposed according to desired design requirements.

The ceramic circuit board 13 has an electrical insulating board 14, conductive patterns 15a and 15b formed on the front surface of the electrical insulating board 14, and a metal plate 16 disposed on the rear surface of the electrical insulating board 14. The electrical insulating board 14 is made of ceramics with high thermal conductivity, such as aluminum oxide, aluminum nitride, and silicon nitride that have excellent thermal conductivity. The electrical insulating board 14 has a thickness preferably ranging between 0.2 mm and 1.5 mm, inclusive, and more preferably between 0.25 mm and 1.0 mm, inclusive. The conductive patterns 15a and 15b are made of a material with high electrical conductivity. Examples of the material include copper, aluminum, and an alloy containing at least one of these. The conductive patterns 15a and 15b each have a thickness preferably ranging between 0.1 mm and 1.0 mm, inclusive, and more preferably between 0.125 mm and 0.6 mm, inclusive. On these conductive patterns 15a and 15b, the semiconductor elements 11a and 11b are disposed with solder 12a and 12b. In this connection, in addition to the semiconductor elements 11a and 11b, electronic components such as thermistors and capacitors, wiring members such as bonding wires, a lead frame, and connecting terminals, and others may be desirably mounted on the conductive patterns 15a and 15b. In addition, plating may be performed on the conductive patterns 15a and 15b using a material with high corrosion resistance. Examples of the material include nickel, titanium, chromium, molybdenum, tantalum, niobium, tungsten, vanadium, bismuth, zirconium, hafnium, gold, silver, platinum, palladium, and an alloy containing at least one of these. In this connection, although the quantity, locations, and shapes of the conductive patterns 15a and 15b are illustrated in FIG. 1 by way of example, the quantity, locations, and shapes are not limited thereto and may be determined according to desired design requirements.

The metal plate 16 is made of metal with high thermal conductivity, such as copper, aluminum, iron, silver, or an alloy containing at least one of these. The metal plate 16 has a thickness T1 preferably ranging between 0.1 mm and 1.0 mm, inclusive, and more preferably between 0.125 mm and 0.6 mm, inclusive. In addition, a plurality of dimples 16a and 16b (concave portions) are formed in the rear surface of the metal plate 16. The dimples 16a and 16b do not penetrate the metal plate 16. The dimples 16a and 16b have a depth D that preferably ranges between 30% and 95%, inclusive, of the thickness T1 of the metal plate 16, and more preferably between 60% and 90%, inclusive, of the thickness T1 of the metal plate 16. Deeper dimples 16a and 16b produce a higher effect of reducing stress. However, if the dimples 16a and 16b are too deep, voids are likely to occur between solder 18 and the dimples 16a and 16b, which may result in a deterioration in heat dissipation performance and occurrence of partial discharge. For example, in the case where the metal plate 16 has a thickness T1 of approximately 0.3 mm, the dimples 16a and 16b have a depth D of approximately 0.25 mm and the metal plate 16 has a thickness T2 of approximately 0.05 mm between the bottom of each dimple 16a and 16b and the front surface of the metal plate 16. In addition, the first region and the second region are defined on the metal plate 16, as illustrated in FIG. 1. The dimples 16a and 16b and first and second regions of the metal plate 16 will be described in detail later.

As the ceramic circuit board 13 configured as above, a DCB (Direct Copper Bonding) substrate or an AMB (Active Metal Brazed) substrate may be used, for example. The ceramic circuit board 13 is able to conduct heat generated by the semiconductor elements 11a and 11b, to the heat dissipation plate 17 through the conductive patterns 15a and 15b, electrical insulating board 14, and metal plate 16. In this connection, the electrical insulating board 14 is rectangular in a plan view, for example. In addition, the metal plate 16 is rectangular and is smaller in size than the electrical insulating board 14 in the plan view. Therefore, the ceramic circuit board 13 is rectangular, for example.

As illustrated in FIG. 1, the ceramic circuit board 13 is disposed on the front surface of the heat dissipation plate 17 with the solder 18. This heat dissipation plate 17 is made of a material with high thermal conductivity, such as aluminum, iron, silver, copper, an alloy containing at least one of these, a composite material of aluminum and silicon carbide, or a composite material of magnesium and silicon carbide. In addition, to improve corrosion resistance, for example, plating may be performed on the surface of the heat dissipation plate 17 using a material such as nickel. Specific examples of the material include, other than nickel, a nickel-phosphorus alloy, a nickel-boron alloy, and others. In this connection, a cooling unit (not illustrated) may be joined to the rear surface of the heat dissipation plate 17 using solder, silver solder, or the like, or may be mechanically joined thereto using a thermal paste or the like. This further improves the heat dissipation performance. The cooling unit in this case may be made of, for example, a material with high thermal conductivity, such as aluminum, iron, silver, copper, or an alloy containing at least one of these. As the cooling unit, fins, a heat sink with a plurality of fins, or a cooling device employing water cooling may be used. The heat dissipation plate 17 may be formed integrally with such a cooling unit. In this case, the heat dissipation plate is made of a material with high thermal conductivity, such as aluminum, iron, silver, copper, or a material containing at least one of these. In addition, in order to improve corrosion resistance, for example, plating using a material such as nickel may be performed on the surface of the heat dissipation plate formed integrally with the cooling unit. Specific examples of the material include, other than nickel, a nickel-phosphorus alloy, a nickel-boron alloy, and others. In addition, in place of the above heat dissipation plate 17, the above cooler unit may be joined to the rear surface of the ceramic circuit board 13 with the solder 18. In this connection, the solder 12a, 12b, and 18 used in the above semiconductor device 10 is lead-free solder mainly containing one of a tin-silver-copper alloy, a tin-zinc-bismuth alloy, a tin-copper alloy, or a tin-silver-indium-bismuth alloy. In addition, an additive such as nickel, germanium, cobalt, or silicon may be added to the solder.

In addition, in the semiconductor device 10 configured as above, the semiconductor elements 11a and 11b and ceramic circuit board 13 on the heat dissipation plate 17 may be sealed by a sealing member. Alternatively, a case may be attached to the heat dissipation plate 17 so as to surround the semiconductor elements 11a and 11b and ceramic circuit board 13, and the case may be filled with a sealing member. In this case, as such a sealing member, a thermosetting resin, such as epoxy resin, phenol resin, maleimide resin, silicone resin, or silicone gel, may be used. In addition, as a filler, a filling material such as silicon oxide, aluminum oxide, boron nitride, or aluminum nitride may be contained. The case is box-shaped so as to cover the sides of the semiconductor elements 11a and 11b and ceramic circuit board 13, and is formed of a thermoplastic resin. As the resin, polyphenylene sulfide resin (PPS), polybutylene terephthalate (PBT) resin, polybutylene succinate (PBS) resin, polyamide (PA) resin, or acrylonitrile-butadiene-styrene (ABS) resin, or the like may be used. In addition, such a case is bonded to the heat dissipation plate 17 with an adhesive (not illustrated).

Figure 2:
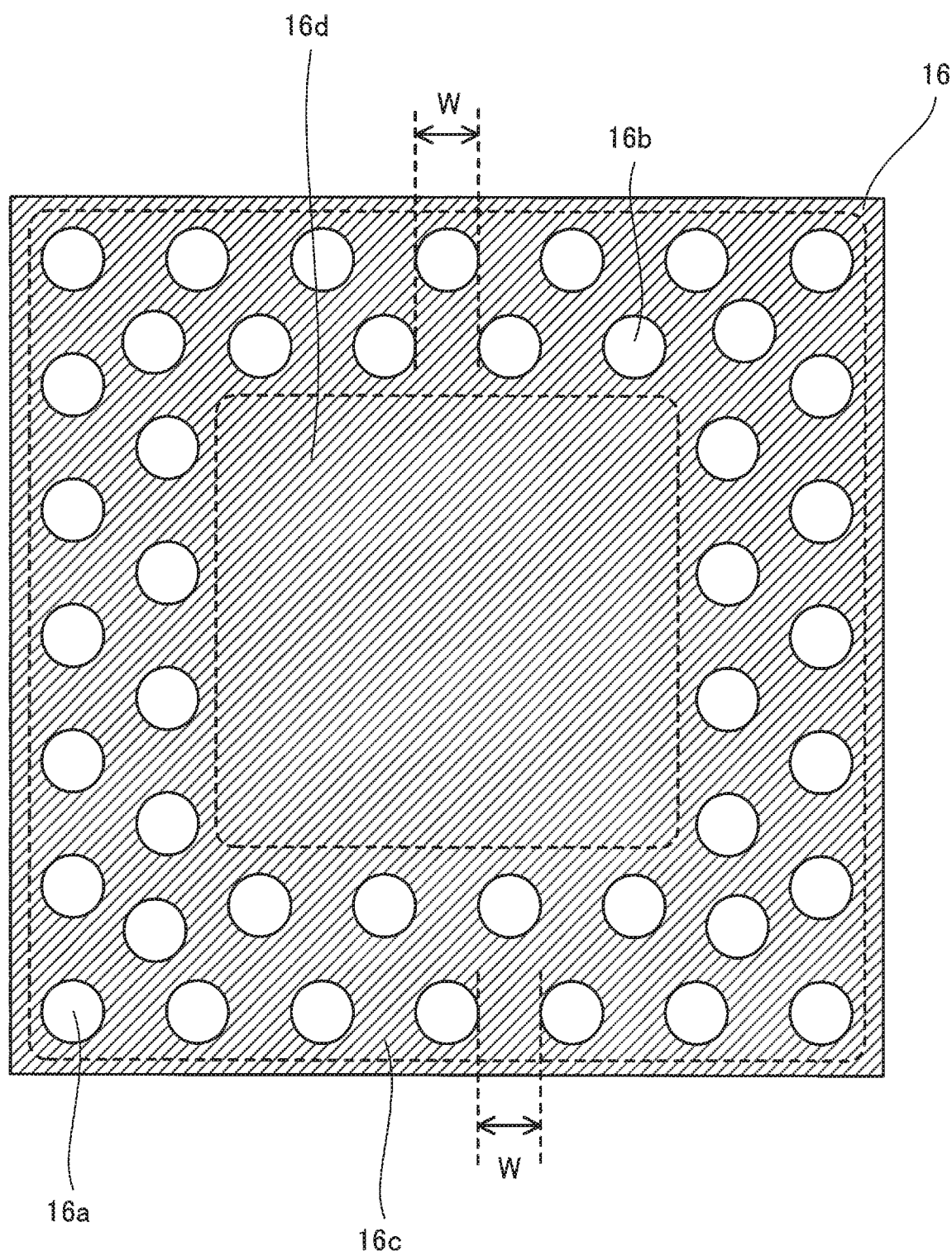
FIG. 2 is a plan view of the rear surface of a metal plate of a ceramic circuit board of the semiconductor device according to the first embodiment.

The following describes the dimples 16a and 16b in the metal plate 16 of the ceramic circuit board 13 in the semiconductor device 10 with reference to FIG. 2. FIG. 2 is a plan view of the rear surface of the metal plate of the ceramic circuit board in the semiconductor device according to the first embodiment. In this connection, FIG. 2 illustrates the metal plate 16 of the ceramic circuit board 13 in the semiconductor device 10 of FIG. 1 as seen from the rear surface. In the rear surface of the metal plate 16, a first region 16c in which the dimples 16a and 16b are formed in a ring shape along the outer periphery of the metal plate 16 and a second region 16d without any dimples 16a and 16b, other than the first region 16c, are defined.

The first region 16c is defined as a region surrounding the central portion of the metal plate 16. In the outer portion of the first region 16c, the dimples 16a are formed at prescribed intervals W in a ring shape along the outer periphery of the metal plate 16. Further inside than the dimples 16a, the dimples 16b are formed at prescribed intervals W in a ring shape along the outer periphery of the metal plate 16. If the intervals W are too narrow, the solder 18 does not flow smoothly. If the intervals W are too wide, the effects of the dimples 16a and 16b are not obtained. The intervals W of the dimples 16a and 16b preferably range between 0.1 mm and 0.5 mm, inclusive, and more preferably between 0.15 mm and 0.3 mm, inclusive. In this connection, although the first embodiment illustrates the case where the dimples 16a and 16b form two lines along the outer periphery of the metal plate 16, the number of lines of dimples is not limited thereto. One line of dimples or three or more lines of dimples may be formed.

In addition, the second region 16d is defined at the central portion of the metal plate 16 and is surrounded by the first region 16c. The semiconductor elements 11a and 11b of the semiconductor device 10 are disposed above the second region 16d of the metal plate 16 of the ceramic circuit board 13, as illustrated in FIG. 1. Heat generated by the semiconductor elements 11a and 11b is transferred to the first region 16c of the metal plate 16 through the conductive patterns 15a and 15b and electrical insulating board 14. For example, in the case where the semiconductor elements 11a and 11b are disposed above the first region 16c of the metal plate 16 of the ceramic circuit board 13, the thermal conductivity drops because of the plurality of dimples 16a and 16b formed in the first region 16c of the metal plate 16. On the other hand, in the case where the semiconductor elements 11a and 11b are disposed above the second region 16d of the metal plate 16 of the ceramic circuit board 13, a deterioration in heat dissipation performance is suppressed, as compared with the case of disposing these semiconductor elements 11a and 11b above the first region 16c. In this connection, FIGS. 1 and 2 illustrate the dimples 16a and 16b that are formed in a ring shape in a plan view (hemispherical in a cross-sectional view). However, the shapes of the dimples 16a and 16b are not limited thereto, and the dimples 16a and 16b may be formed in an oval shape, slotted hole shape, or square shape in the plan view. In addition, the dimples 16a and 16b may be square-shaped, trapezoidal-shaped, or triangle-shaped in the cross-sectional view, for example.

As described above, in the semiconductor device 10, the plurality of dimples 16a and 16b are formed in a ring shape along the outer periphery of the metal plate 16 in the first region 16c closer to the outer periphery in the rear surface of the metal plate 16 of the ceramic circuit board 13. Therefore, when thermal stress due to temperature changes in the semiconductor device 10 is applied to the ceramic circuit board 13, the plurality of dimples 16a and 16b suppress contraction in the ceramic circuit board 13 that is caused due to the temperature changes. As a result, cracks in the ceramic circuit board 13 and separation of the metal plate 16 and conductive patterns 15a and 15b are prevented.

In addition, the dimples 16a and 16b formed in the rear surface of the metal plate 16 do not penetrate the metal plate 16. The metal plate 16 has a thickness between the bottom of each dimple 16a and 16b and the front surface of the metal plate 16. Therefore, the semiconductor device 10 provides high reliability, without the need of reducing the number of mounted components such as the semiconductor elements 11a and 11b. The dimples 16a and 16b are filled with the solder 18, so that the solder 18 is joined to the metal plate 16. In addition, the solder 18 filling the dimples 16a and 16n does not allow generation of voids in the dimples 16a and 16b. This prevents a deterioration in heat dissipation performance and occurrence of partial discharge. In this connection, FIG. 2 illustrates the case where the plurality of dimples 16a and 16b are formed in a ring shape along the outer periphery of the metal plate 16 in the first region 16c in the rear surface of the metal plate 16 of the ceramic circuit board 13, but the arrangement of the dimples 16a and 16b is not limited thereto. Alternatively, the plurality of dimples 16a and 16b may be formed along the two short sides of the rectangular metal plate 16 in the first region 16c, and no dimples are formed on the two long sides thereof. Yet alternatively, for example, the plurality of dimples 16a and 16b may be formed only in the vicinity of the corners of the metal plate 16 in the first region 16c. In addition, although FIG. 2 illustrates the case where the dimples 16a are formed at the corners of the first region 16c corresponding to the corners of the rectangular metal plate 16, the arrangement of the dimples 16a is not limited thereto. For example, a plurality of dimples 16a may be formed in an arrow shape in the vicinity of the corners of the first region 16c corresponding to the corners of the metal plate 16. In addition, for example, if the corners of the metal plate 16 are chamfered, the corners of the first region 16c may be chamfered accordingly. In this case, the dimples 16a may be formed along the edges of the chamfered first region.

By the way, in the semiconductor device 10, a damage due to thermal stress acting on the ceramic circuit board 13 may be further prevented depending on the locations of the dimples 16a and 16b with respect to the ceramic circuit board 13. The following describes the appropriate locations of the dimples 16a and 16b with respect to the ceramic circuit board 13 in order to securely prevent the damage due to thermal stress acting on the ceramic circuit board 13 of the semiconductor device 10.

Figure 3:
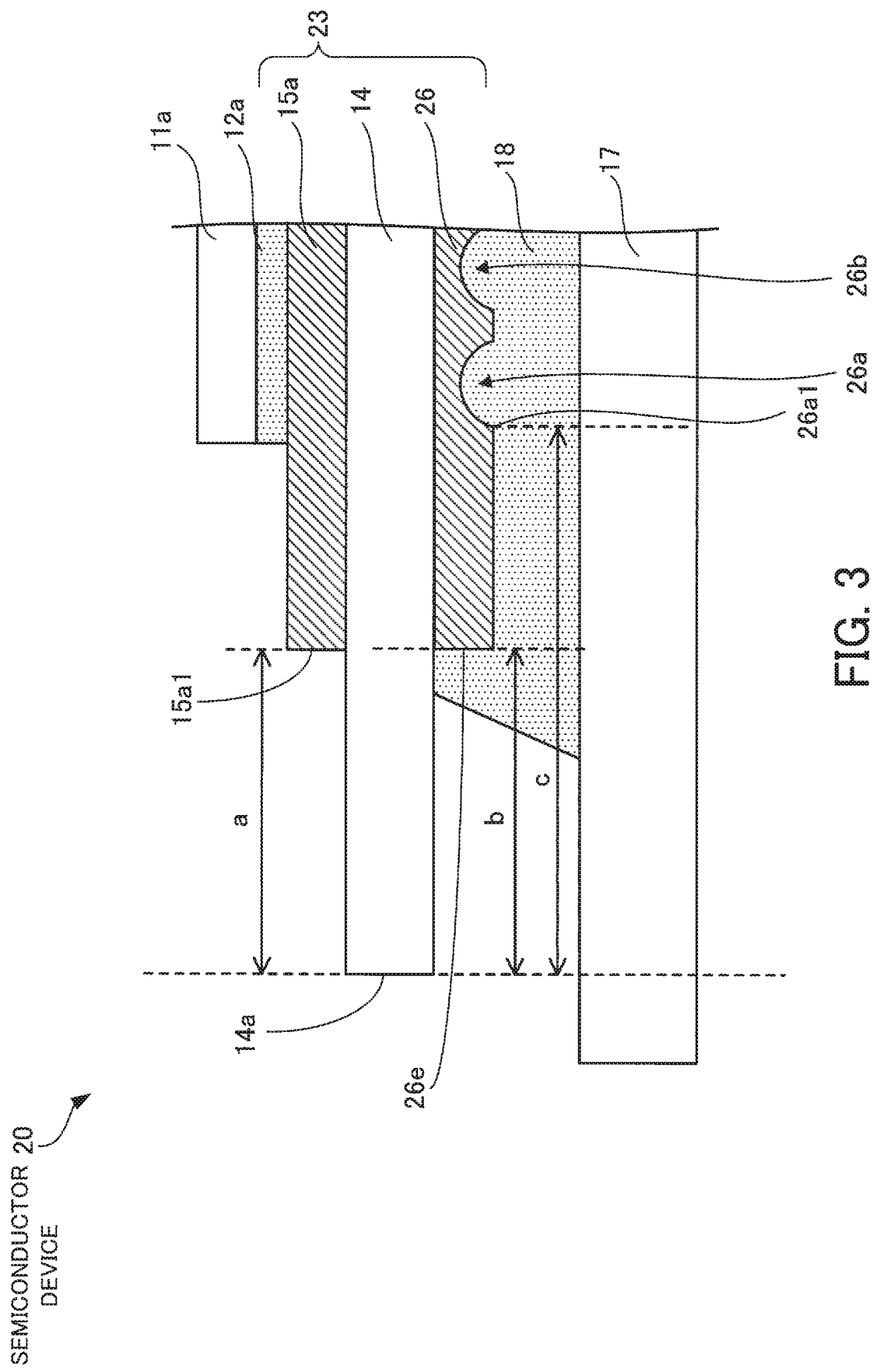
FIG. 3 is an enlarged cross-sectional view of a main part of a semiconductor device as a reference example (part 1)
Figure 4:
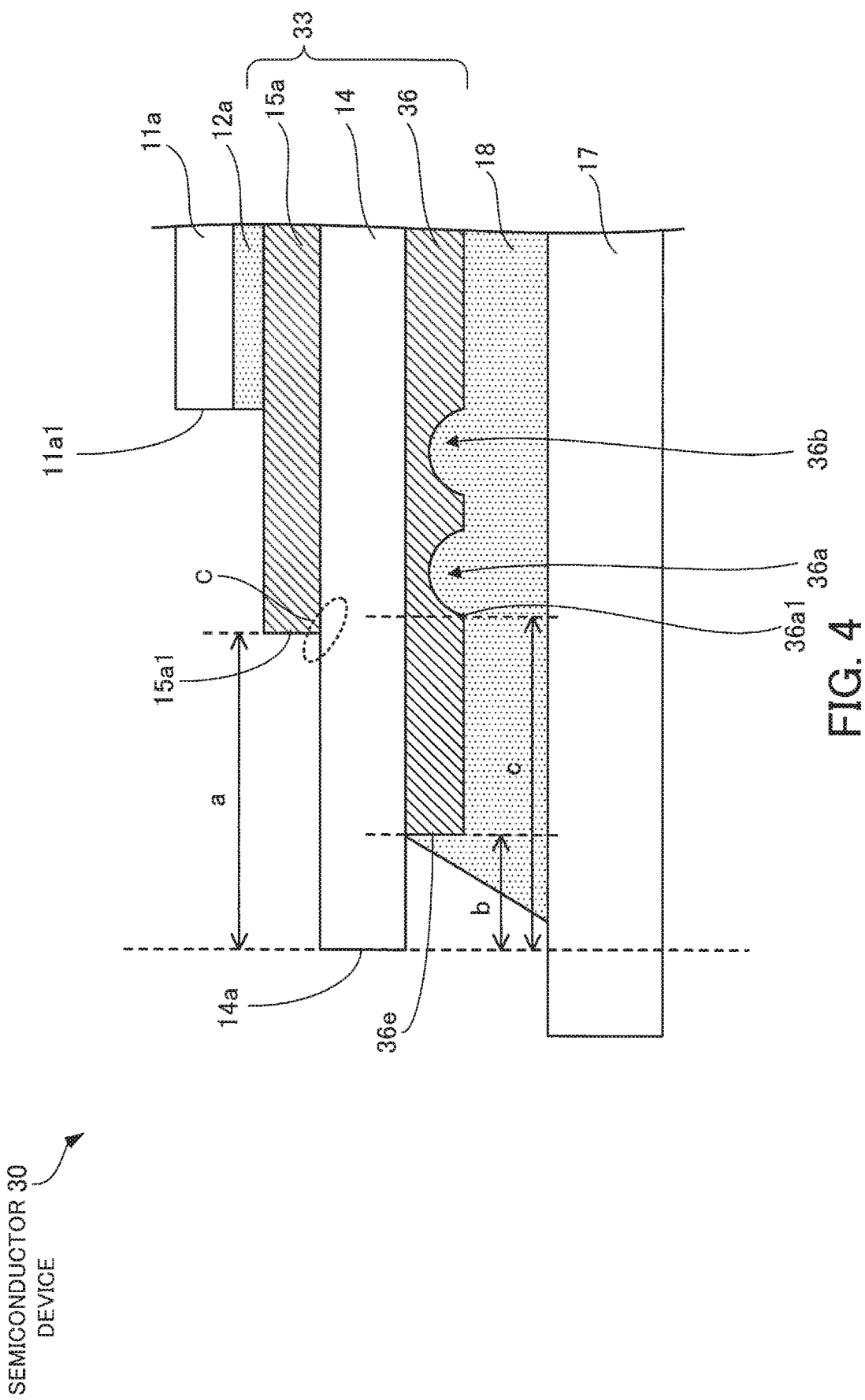
FIG. 4 is an enlarged cross-sectional view of a main part of a semiconductor device as a reference example (part 2)

First, semiconductor devices, as reference examples, will be described with reference to FIGS. 3 and 4. FIGS. 3 and 4 are each an enlarged cross-sectional view of a main part of a semiconductor device as a reference example. In this connection, the semiconductor devices 20 and 30 in FIGS. 3 and 4 each have the identical structure to the semiconductor device 10 of FIG. 1, except for the metal plate of the semiconductor device 10. The same reference numerals as used in FIG. 1 are given to corresponding parts, and these parts will therefore not be described again. In addition, FIGS. 3 and 4 each illustrate an enlarged view of an area of the semiconductor device 20 or 30 corresponding to the area around the dimples 16a and 16b formed on the left side of the semiconductor device 10 of FIG. 1.

As illustrated in FIG. 3, the semiconductor device includes a semiconductor element 11a, a ceramic circuit board 23 where the semiconductor element 11a is joined to its front surface, and a heat dissipation plate 17 joined to the rear surface of the ceramic circuit board 23. The ceramic circuit board 23 has an electrical insulating board 14, a conductive pattern 15a formed on the front surface of the electrical insulating board 14, and a metal plate 26 disposed on the rear surface of the electrical insulating board 14. A plurality of dimples 26a and 26b are formed in the rear surface of the metal plate 26. The dimples 26a and 26b do not penetrate the metal plate 36.

Referring to FIG. 3, in the ceramic circuit board 23 of this semiconductor device 20, a distance a is defined as a distance between the position of the outermost end face 14a of the electrical insulating board 14 and the position of a first end face 15a1 at the outermost edge of the conductive pattern 15a, and a distance b is defined as a distance between the position of the outermost end face 14a of the electrical insulating board 14 and the position of a second end face 26e at the outermost edge of the metal plate 26. The distance a and the distance b are equal to each other in the semiconductor device 20. That is, in the ceramic circuit board 23, the position of the first end face 15a1 of the conductive pattern 15a and the position of the second end face 26e at the outermost edge of the metal plate 26 are aligned vertically. In addition, a distance c is defined as a distance between the position of the outermost end face 14a of the electrical insulating board 14 and the position of the outermost edge 26a1 of the dimple 26a formed in the outermost portion of the rear surface of the metal plate 26. In the semiconductor device 20, the following expressions are satisfied: distance a=distance b; and distance c>distance a. That is, in the semiconductor device 20, the dimples 26a and 26b are formed further inside than the first end face 15a1 of the conductive pattern 15a.

In this semiconductor device 20, distance a=distance b. Therefore, even when the temperature changes, a small bending stress is applied to the electrical insulating board 14 in the ceramic circuit board 23. However, stress is concentrated at a portion directly under the first end face 15a1 of the conductive pattern 15a and its surroundings and a portion directly above the second end face 26e of the metal plate 26 and its surroundings, irrespective of existence or absence of the dimples 26a and 26b. Since these portions on which the stress is concentrated are opposite to each other on both sides of the electrical insulating board 14, the electrical insulating board 14 may get cracked in the corresponding area and then break.

In addition, as illustrated in FIG. 4, the semiconductor device 30 includes a semiconductor element 11a, a ceramic circuit board 33 where the semiconductor element 11a is joined to its front surface, and a heat dissipation plate 17 joined to the rear surface of the ceramic circuit board 33. The ceramic circuit board 33 has an electrical insulating board 14, a conductive pattern 15a formed on the front surface of the electrical insulating board 14, and a metal plate 36 disposed on the rear surface of the electrical insulating board 14. A plurality of dimples 36a and 36b are formed in the rear surface of the metal plate 36. The dimples 36a and 36b do not penetrate the metal plate 36.

As illustrated in FIG. 4, in the ceramic circuit board 33 of this semiconductor device 30, a distance a is defined as a distance between the position of the outermost end face 14a of the electrical insulating board 14 and the position of a first end face 15a1 at the outermost edge of the conductive pattern 15a, and a distance b is defined as a distance between the position of the outermost end face 14a of the electrical insulating board 14 and the position of a second end face 36e at the outermost edge of the metal plate 36. In addition, a distance c is defined as a distance between the position of the outermost end face 14a of the electrical insulating board 14 and the position of the outermost edge 36a1 of the dimple 36a formed in the outermost portion of the rear surface of the metal plate 36. In the semiconductor device 30, the following expressions are satisfied: distance a>distance b; and distance c>distance a. That is, in the semiconductor device 30, the dimples 36a and 36b are formed further inside than the first end face 15a1 of the conductive pattern 15a. In the ceramic circuit board 33 of the semiconductor device 30, when thermal stress is generated due to temperature changes, an inflection point occurs at a portion directly under the first end face 15a1 of the conductive pattern 15a and its surroundings. Therefore, the electrical insulating board 14 gets cracked in the area surrounded by the broken circle C in FIG. 4 and then may break.

Figure 5:
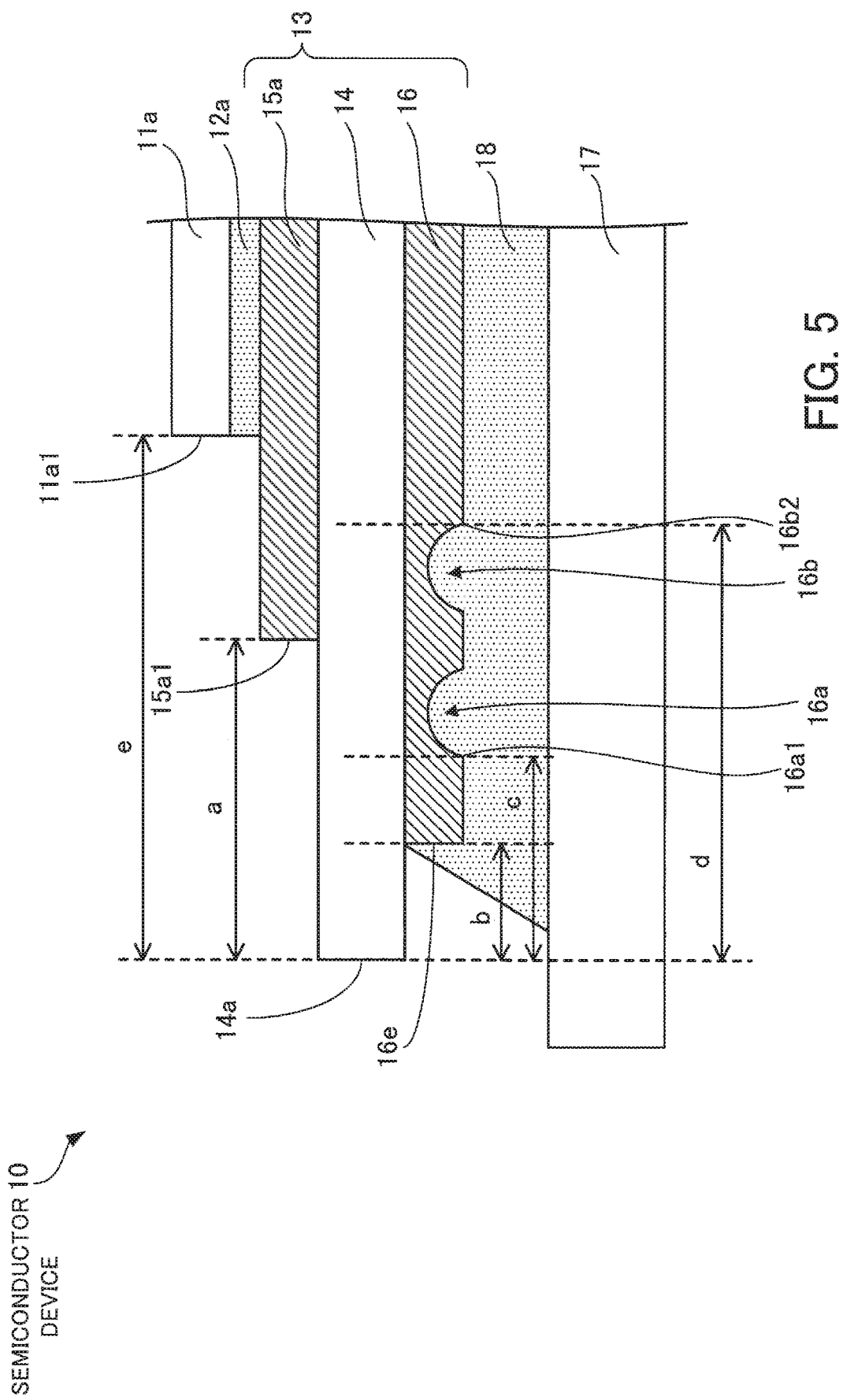
FIG. 5 is an enlarged cross-sectional view of a main part of the semiconductor device according to the first embodiment.

The following describes the semiconductor device 10 of the first embodiment in which the dimples 16a and 16b are formed in the metal plate 16 to deal with the above points, with reference to FIG. 5. FIG. 5 is an enlarged cross-sectional view of a main portion of the semiconductor device according to the first embodiment. More specifically, FIG. 5 is an enlarged view of an area around the dimples 16a and 16b formed on the left side of the semiconductor device 10 of FIG. 1. In this connection, an area around the dimples 16a and 16b, formed on the right side of the semiconductor device 10, has the same structure.

Referring to FIG. 5, in the ceramic circuit board 13, a distance a is defined as a distance between the position of the outermost end face 14a of the electrical insulating board 14 and the position of a first end face 15a1 at the outermost edge of the conductive pattern 15a. A distance b is defined as a distance between the position of the outermost end face 14a of the electrical insulating board 14 and the position of a second end face 16e at the outermost edge of the metal plate 16. In this semiconductor device 10, the ceramic circuit board 13 is formed such as to satisfy the following expression: distance b<distance a. In this connection, with respect to the conductive pattern 15b not illustrated in FIG. 5, the distance a also refers to the distance between the position of the outermost end face 14a of the electrical insulating board 14 and the position of the first end face at the outermost edge of the conductive pattern 15a. In addition, a distance c is defined as a distance between the position of the outermost end face 14a of the electrical insulating board 14 and the position of the outermost edge 16a1 of the dimple 16a formed in the outermost portion of the rear surface of the metal plate 16. A distance d is defined as a distance between the position of the outermost end face 14a of the electrical insulating board 14 and the position of the innermost edge 16b2 of the dimple 16b formed in the innermost portion of the rear surface of the metal plate 16. A distance e is defined as a distance between the position of the outermost end face 14a of the electrical insulating board 14 and a third end face 11a1 of the semiconductor element 11a. In this semiconductor device 10, the ceramic circuit board 13 and dimples 16a and 16b are formed such as to satisfy the following expressions: distance c<distance a; distance a<distance d; and distance d<distance e. When thermal stress due to temperature changes is generated in the ceramic circuit board 13 of the semiconductor device 10, stress is suppressed in an area between the position of the outermost edge 16a1 of the dimple 16a and the position of the innermost edge 16b2 of the dimple 16b. Therefore, only a small deformation is caused in the vicinity of the conductive pattern 15a, and no inflection point occurs. Therefore, cracks in the electrical insulating board 14 are prevented.

The semiconductor device 10 includes the semiconductor elements 11a and 11b and the ceramic circuit board 13. The ceramic circuit board 13 includes the electrical insulating board 14, conductive patterns 15a and 15b formed on the front surface of the electrical insulating board 14 and on which the semiconductor elements 11a and 11b are disposed, and the metal plate 16 that is disposed on the rear surface of the electrical insulating board 14, has the second end face 16e located further outside than the first end face 15a1 of the conductive pattern 15a and has the plurality of dimples 16a formed along at least part of its outer periphery in its rear surface. In addition, in the semiconductor device 10, the outermost edge 16a1 of the dimple 16a is located further outside than the first end face 15a1 of the conductive pattern 15a in a cross-sectional view. Therefore, even when thermal stress due to temperature changes in the semiconductor device 10 is applied to the ceramic circuit board 13, the plurality of dimples 16a and 16b suppress deformation of the ceramic circuit board 13 that is caused due to the temperature changes. Therefore, cracks in the ceramic circuit board 13 and separation of the metal plate 16 and conductive patterns 15a and 15b are prevented.

In addition, in the semiconductor device 10, the innermost edge 16b2 of the dimple 16b is located further inside than the first end face 15a1 of the conductive pattern 15a in a cross-sectional view. In addition, the innermost edge 16b2 of the dimple 16b is located further outside than the third end face 11a1 of the semiconductor element 11a in the cross-sectional view. Therefore, deformation of the ceramic circuit board 13 due to temperature changes is further suppressed. Even when an external stress is applied to the outer periphery of the ceramic circuit board 13, cracks in the electrical insulating board 14 are prevented.

In addition, the dimples 16a and 16b formed in the rear surface of the metal plate 16 do not penetrate the metal plate 16, and the metal plate 16 has a thickness between the bottom of each dimple 16a and 16b and the front surface of the metal plate 16. The dimples 16a and 16b are filled with the solder 18, so that the solder 18 is joined to the metal plate 16. In addition, the solder 18 filling the dimples 16a and 16b does not allow creation of voids in the dimples 16a and 16b. Therefore, a deterioration in heat dissipation performance and occurrence of partial discharge are prevented. In addition, the intervals W at which the dimples 16a and 16b are formed in the first region 16c in the rear surface of the metal plate 16 range between 0.1 mm and 0.5 mm, inclusive. Therefore, the solder 18 wet-spreads up to the outer periphery of the ceramic circuit board 13, so that the solder 18 enables firmly joining the ceramic circuit board 13 and the heat dissipation plate 17 together without voids. As a result, a deterioration in the quality of the semiconductor device 10 and thus a reduction in the reliability thereof are prevented.

Second Embodiment

Figure 6:
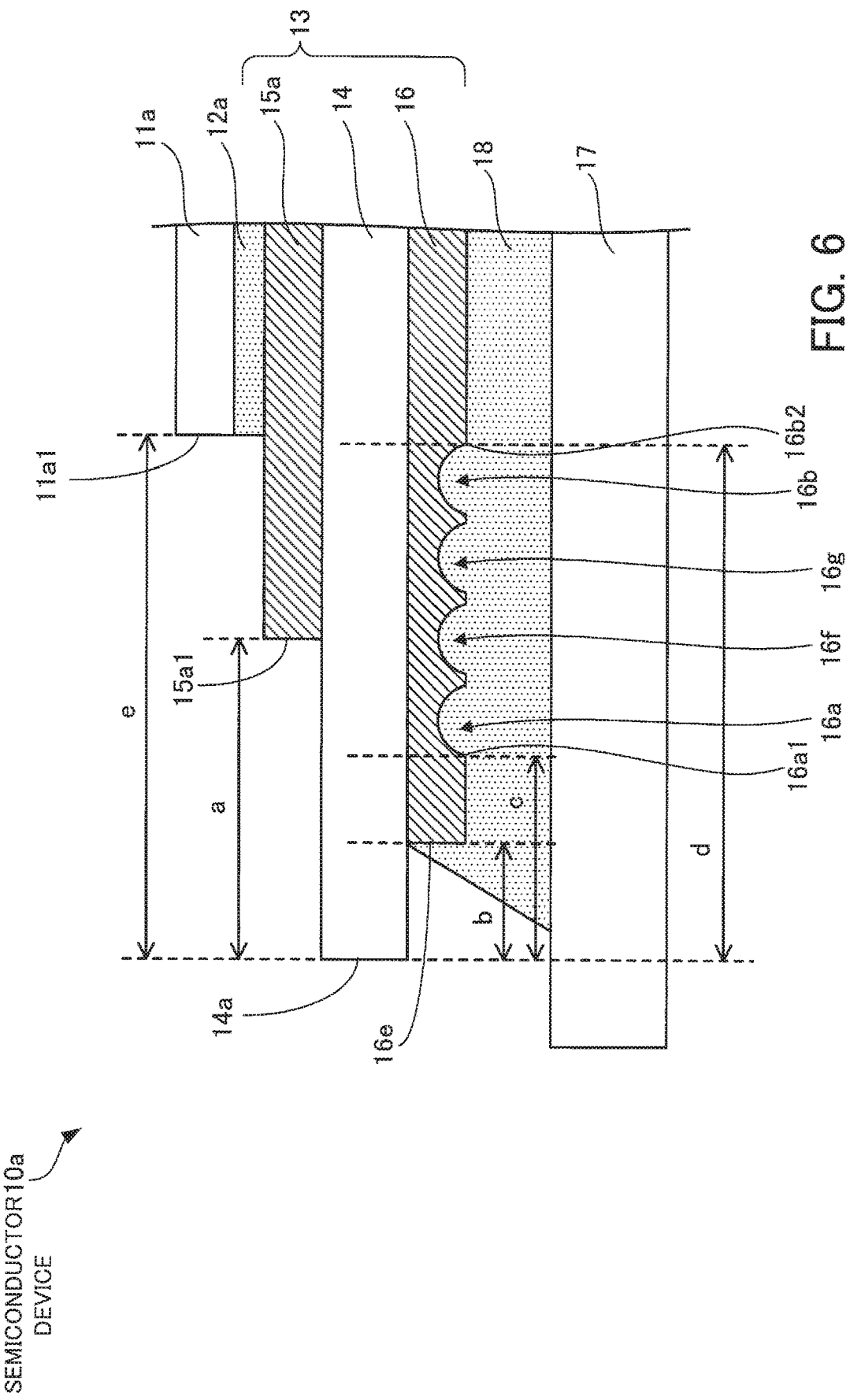
FIG. 6 is an enlarged cross-sectional view of a main part of a semiconductor device according to a second embodiment.

A second embodiment describes a semiconductor device in which more dimples are formed than those formed in the metal plate 16 of the first embodiment, with reference to FIG. 6. FIG. 6 is an enlarged cross-sectional view of a main portion of the semiconductor device of the second embodiment. The semiconductor device 10a of FIG. 6 has the same structure as the semiconductor device 10, except for the metal plate 16 of the semiconductor device 10. In addition, the same reference numerals as used in FIG. 1 are given to corresponding parts, and these parts will therefore not be described again. FIG. 6 is an enlarged view of an area of the semiconductor device 10a corresponding to the area around the dimples 16a and 16b formed on the left side of the semiconductor device 10 of FIG. 1.

As illustrated in FIG. 6, the semiconductor device 10a includes a semiconductor element 11a, a ceramic circuit board 13 where the semiconductor element 11a is joined to its front surface, and a heat dissipation plate 17 joined to the rear surface of the ceramic circuit board 13. The ceramic circuit board 13 includes an electrical insulating board 14, conductive patterns 15a and 15b formed on the front surface of the electrical insulating board 14, and a metal plate 16 disposed on the rear surface of the electrical insulating board 14. The metal plate 16 has dimples 16a and 16b, and further has dimples 16f and 16g formed between the dimples 16a and 16b in the rear surface (first region 16c (see FIG. 2)) of the metal plate 16 in a cross-sectional view. These dimples 16f and 16g do not penetrate the metal plate 16, and are the same in size as the dimples 16a and 16b. For example, in the outer portion of the first region 16c, the dimples 16a of the dimples 16a, 16b, 16f, and 16g are formed at prescribed intervals W in a ring shape along the outer periphery of the metal plate 16. In addition, further inside than the dimples 16a, the dimples 16f are formed at prescribed intervals W in a ring shape along the outer periphery of the metal plate 16. Further inside than the dimples 16f, the dimples 16g are formed at prescribed intervals W in a ring shape along the outer periphery of the metal plate 16. In the innermost portion, the dimples 16b are formed at prescribed intervals W in a ring shape along the outer periphery of the metal plate 16.

In addition, in the ceramic circuit board 13 of the semiconductor device 10a, the distance a, distance b, and distance e are defined. In addition, a distance c is defined as a distance between the position of the outermost end face 14a of the electrical insulating board 14 and the position of the outermost edge 16a1 of the dimple 16a formed in the outermost portion of the rear surface of the metal plate 16. A distance d is defined as a distance between the position of the outermost end face 14a of the electrical insulating board 14 and the position of the innermost edge 16b2 of the dimple 16b formed in the innermost portion of the rear surface of the metal plate 16. In this semiconductor device 10a, the ceramic circuit board 13 and dimples 16a, 16b, 16f and 16g are formed such as to satisfy the following expressions: distance c<distance a; distance a<distance d; and distance d<distance e.

When thermal stress due to temperature changes is generated in the ceramic circuit board 13 of the semiconductor device 10a, stress in the vicinity of the conductive pattern 15a is suppressed in an area between the position of the outermost edge 16a1 of the dimple 16a and the position of the innermost edge 16b2 of the dimple 16b. Therefore, only a small deformation is caused, and no inflection point occurs. Therefore, cracks in the electrical insulating board 14 are prevented. The second embodiment has described the example where two dimples 16f and 16g are additionally formed between the dimples 16a and 16b. Alternatively, one dimple or three or more dimples may additionally be formed between the dimples 16a and 16b.

Third Embodiment

Figure 7:
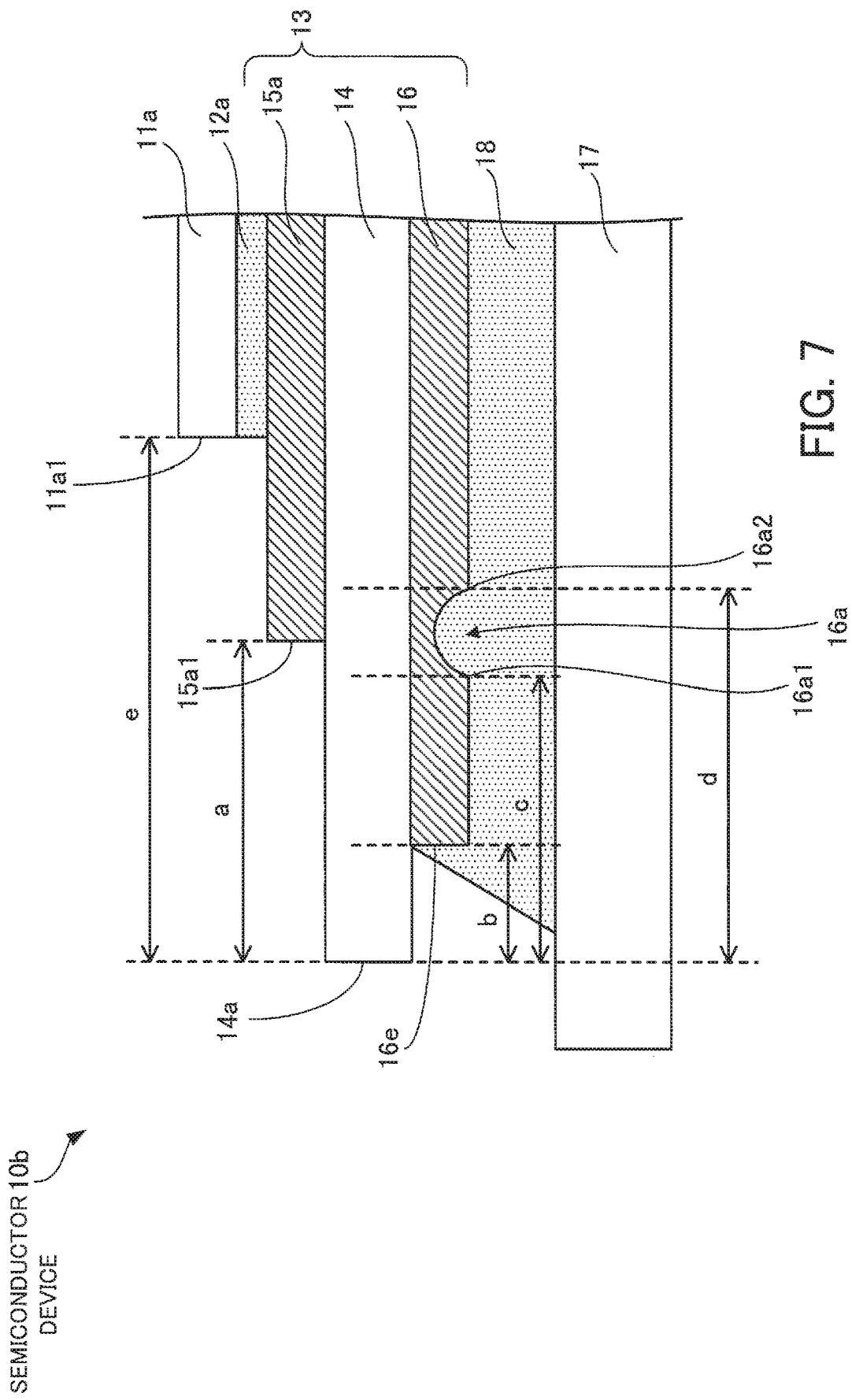
FIG. 7 is an enlarged cross-sectional view of a main part of a semiconductor device according to a third embodiment.

A third embodiment describes a semiconductor device in which one line of dimples is formed in the metal plate 16 of the first embodiment, with reference to FIG. 7. FIG. 7 is an enlarged cross-sectional view of a main portion of the semiconductor device of the third embodiment. Please note that the semiconductor device 10b of FIG. 7 has the same structure as the semiconductor device 10. The same reference numerals as used in FIG. 1 are given to corresponding parts, and these parts will therefore not be described again. FIG. 7 is an enlarged view of an area of the semiconductor device 10b corresponding to the area around the dimples 16a and 16b formed on the left side of the semiconductor device 10 of FIG. 1.

As illustrated in FIG. 7, the semiconductor device 10b includes a semiconductor element 11a, a ceramic circuit board 13 where the semiconductor element 11a is joined to its front surface, and a heat dissipation plate 17 joined to the rear surface of the ceramic circuit board 13. The ceramic circuit board 13 includes an electrical insulating board 14, conductive patterns 15a and 15b formed on the front surface of the electrical insulating board 14, and a metal plate 16 disposed on the rear surface of the electrical insulating board 14. The metal plate 16 has only dimples 16a in the rear surface (first region 16c (see FIG. 2)) of the metal plate 16 in a cross-sectional view. The dimples 16a are formed, for example, at prescribed intervals W along the outer periphery of the metal plate 16 in the first region 16c. In addition, in the ceramic circuit board 13 of the semiconductor device 10b, the distance a, distance b, and distance e are defined. In addition, a distance c is defined as a distance between the position of the outermost end face 14a of the electrical insulating board 14 and the position of the outermost edge 16a1 of the dimple 16a formed in the outermost portion of the rear surface of the metal plate 16. A distance d is defined as a distance between the position of the outermost end face 14a of the electrical insulating board 14 and the position of the innermost edge 16a2 of the dimple 16a formed in the innermost portion of the rear surface of the metal plate 16. In this semiconductor device 10b, the ceramic circuit board 13 and dimples 16a are formed such as to satisfy the following expressions: distance c<distance a; distance a<distance d; and distance d<distance e.

When thermal stress due to temperature changes is generated in the ceramic circuit board 13 of the semiconductor device 10b, stress in the vicinity of the conductive pattern 15a is suppressed in an area between the position of the outermost edge 16a1 of the dimple 16a and the position of the innermost edge 16a2 of the dimple 16a. Therefore, only a small deformation is caused, and no inflection point occurs. Therefore, cracks in the electrical insulating board 14 are prevented.

As in the semiconductor device 10 of the first embodiment, in the semiconductor devices 10a and 10b of the second and third embodiments, the dimples 16a, 16b, 16f, and 16g formed in the rear surface of the metal plate 16 do not penetrate the metal plate 16, and the metal plate 16 has a thickness between the bottom of each dimple 16a, 16b, 16f, and 16g and the front surface of the metal plate 16. Therefore, the dimples 16a, 16b, 16f, and 16g are filled with the solder 18, so that the solder 18 is joined to the metal plate 16. In addition, the solder 18 filling the dimples 16a, 16b, 16f, and 16g does not allow creation of voids in the dimples 16a, 16b, 16f, and 16g. As a result, a deterioration in heat dissipation performance and occurrence of partial discharge are prevented.

The intervals W at which the dimples 16a, 16b, 16f, and 16g are formed in the first region 16c in the rear surface of the metal plate 16 range between 0.1 mm and 0.5 mm, inclusive. Therefore, the solder 18 wet-spreads up to the outer periphery of the ceramic circuit board 13, so that the solder 18 enables firmly joining the ceramic circuit board 13 and the heat dissipation plate 17 together without voids. As a result, a deterioration in the quality of the semiconductor devices 10a and 10b and thus a reduction in the reliability thereof are prevented.

According to the disclosed embodiments, a semiconductor device is provided, which is compact and is able to suppress thermal stress to thereby prevent a reduction in its reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a semiconductor element; and
a substrate including
an electrical insulating board having a front surface and a rear surface opposite to the front surface,
a plurality of conductive patterns, including an outermost conductive pattern, that are provided on the front surface of the electrical insulating board, the outermost conductive pattern having a conductive pattern outer edge that is closer than any other edges of the plurality of conductive patterns to an outer periphery of the electrical insulating board in a plan view of the device, the semiconductor element being disposed on one of the plurality of conductive patterns, and
a metal plate disposed on the rear surface of the electrical insulating board, having a front surface facing the rear surface of the insulating board, and a rear surface opposite to the front surface of the metal plate, and having a metal plate outer edge that is located outside of a corresponding position of the conductive pattern outer edge of the outermost conductive pattern in the plan view, the metal plate having a plurality of first concave portions respectively provided along at least a part of an outer periphery of the metal plate in the rear surface of the metal plate, each first concave portion having a rounded shape in the plan view, for one of the first concave portions that is located closer than any other first concave portions to both the conductive pattern outer edge and the metal plate outer edge, an outermost point on a first concave portion outer edge, which is closer than any other points on the first concave outer edge to the metal plate outer edge, is located closer than the conductive pattern outer edge of the outermost conductive pattern to the outer periphery of the electrical insulating board in the plan view of the device.

2. The semiconductor device according to claim 1, wherein the metal plate further includes a plurality of second concave portions that are provided further inside from the metal plate outer edge than are the plurality of first concave portions in the plan view, and that are respectively provided along the outer periphery of the metal plate in the rear surface of the metal plate.

3. The semiconductor device according to claim 2, wherein for one of the second concave portions that is located closer than any other second concave portions to both the conductive pattern outer edge and the metal plate outer edge, an innermost point on a second concave portion outer edge, which is farther than any other points on the second concave portion outer edge from the metal plate outer edge, is located farther than the conductive pattern outer edge from the outer periphery of the electrical insulating board edge in the plan view.

4. The semiconductor device according to claim 3, wherein
the semiconductor element has a semiconductor element outer edge, and
for the one of the second concave portions, the innermost point of the second concave portion outer edge, which is farther than any other points on the outer edge from the metal plate outer edge, is located closer than the semiconductor element outer edge of the semiconductor element to the outer periphery of the electrical insulating board in the plan view.

5. The semiconductor device according to claim 2, wherein the metal plate further includes a plurality of additional concave portions aligned in one or more lines that are each located along the outer periphery between the first concave portions and the second concave portions on the rear surface thereof.

6. The semiconductor device according to claim 1, wherein an interval between each adjacent two of the first concave portions provided in the rear surface of the metal plate is in a range of 0.1 mm and 0.5 mm.

7. The semiconductor device according to claim 1, wherein a first thickness between a bottom of each of the first concave portions and the front surface of the metal plate is greater than zero.

8. The semiconductor device according to claim 7, wherein the first thickness is in a range of 30% and 95% of a thickness of the metal plate.

9. The semiconductor device according to claim 2, wherein a second thickness between a bottom of each of the second concave portions and the front surface of the metal plate is greater than zero.

10. The semiconductor device according to claim 9, wherein the second thickness is in a range of 30% and 95% of a thickness of the metal plate.

11. The semiconductor device according to claim 1, wherein the plurality of first concave portions provided along the outer periphery in the rear surface of the metal plate forms a ring shape.

12. The semiconductor device according to claim 11, wherein
the rear surface of the metal plate has a first region in which the first concave portions are provided and has a second region positioned closer to a center of the metal plate than is the first region, and
the semiconductor element is disposed within a region on the conductive pattern that is located at a position corresponding to the second region in the rear surface of the metal plate.

13. The semiconductor device according to claim 1, wherein for the one of the first concave portions that is located closer than any other first concave portions to both the conductive pattern outer edge and the metal plate outer edge, an innermost point on the outer edge, which is farther from the metal plate outer edge than any other points, is located farther than the conductive pattern outer edge of the conductive pattern from the outer periphery of the electrical insulating board in the plan view.

14. The semiconductor device according to claim 1, further comprising a heat dissipation plate to which the substrate is joined with solder.

15. The semiconductor device according to claim 1, wherein the front surface of the metal plate is flat.

16. The semiconductor device according to claim 1, wherein the first concave portions each have a hemispherical shape in a cross-sectional view.

17. The semiconductor device according to claim 1, wherein the first concave portions are each filled with solder.

18. The semiconductor device according to claim 10, wherein the second thickness is in a range of 60% and 90% of the thickness of the metal plate.

19. The semiconductor device according to claim 1, wherein each of the plurality of first concave portions is made of a dimple that is discontinuously formed along the at least the part of the outer periphery of the metal plate in the rear surface of the metal plate.

20. The semiconductor device according to claim 1, wherein the rear surface of the metal plate has a flat area corresponding to an area of the conductive pattern in the plan view, the flat area being free of the first concave portions.

* * * * *